(12) United States Patent
Kagan et al.

(10) Patent No.: US 10,832,856 B2
(45) Date of Patent: Nov. 10, 2020

(54) MAGNETIC COIL SUPPORT IN MAGNETIC RESONANCE IMAGING METHOD AND APPARATUS

(71) Applicant: General Electric Company, Schenectady, NY (US)

(72) Inventors: Alexander Kagan, Guilderland, NY (US); Michael Parizh, Schenectady, NY (US); Anbo Wu, Clifton Park, NY (US); Minfeng Xu, Ballston Lake, NY (US); Paul St. Mark Shadforth Thompson, Stephentown, NY (US); Mark Ernest Vermilyea, Schenectady, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 16/232,784

(22) Filed: Dec. 26, 2018

(65) Prior Publication Data

US 2020/0211764 A1 Jul. 2, 2020

(51) Int. Cl.
*G01V 3/00* (2006.01)
*H01F 27/30* (2006.01)
*G01R 33/34* (2006.01)
*G01R 33/035* (2006.01)
*H01F 6/06* (2006.01)

(52) U.S. Cl.
CPC .......... *H01F 27/30* (2013.01); *G01R 33/035* (2013.01); *G01R 33/34023* (2013.01); *H01F 6/06* (2013.01)

(58) Field of Classification Search
CPC .............. G01R 33/3415; G01R 33/543; G01R 33/5659; G01R 33/36; A61B 5/055
USPC ........................................................ 324/307
See application file for complete search history.

(56) References Cited

U.S. PATENT DOCUMENTS

| | | | | |
|---|---|---|---|---|
| 5,084,676 A | * | 1/1992 | Saho ................. | G01R 33/3854 324/318 |
| 6,717,408 B2 | * | 4/2004 | Minas ................ | G01R 33/3806 324/307 |
| 7,633,294 B2 | | 12/2009 | Leussler et al. | |
| 8,314,615 B2 | * | 11/2012 | Jiang ................. | G01R 33/3802 324/307 |
| 8,653,920 B2 | | 2/2014 | Huang et al. | |
| 9,535,143 B2 | | 1/2017 | Derakhshan et al. | |

(Continued)

FOREIGN PATENT DOCUMENTS

WO 2013102509 A1 7/2013

OTHER PUBLICATIONS

Frohloch, Jurg, et al.; "Computational Analysis and Validation of Coil Arrays for Whole-Brain MR-Imaging at 7 T", 2007 IEEE/ MTT-S International Microwave Symposium, pp. 2217-2220, USA, Jun. 3-8, 2007.

*Primary Examiner* — Walter L Lindsay, Jr.
*Assistant Examiner* — Frederick Wenderoth
(74) *Attorney, Agent, or Firm* — Fletcher Yoder, P.C.

(57) ABSTRACT

An imaging device may include multiple magnetic coils to generate a magnetic field. Additionally, the imaging device may include an outer support affixed to at least one coil of the plurality of magnetic coils and an axial support between at least two coils of the plurality of magnetic coils, wherein the outer support and the axial support operatively share a load corresponding to the generated magnetic fields.

25 Claims, 6 Drawing Sheets

(56) References Cited

U.S. PATENT DOCUMENTS

| | | | |
|---|---|---|---|
| 2004/0006939 A1* | 1/2004 | Jobs | B32B 17/10009 |
| | | | 52/235 |
| 2011/0018539 A1 | 1/2011 | Viswanathan | |
| 2013/0172196 A1* | 7/2013 | Nick | H01F 6/06 |
| | | | 505/166 |
| 2014/0274722 A1* | 9/2014 | Calvert | G01R 33/3815 |
| | | | 505/163 |
| 2015/0206938 A1* | 7/2015 | Rossini | H01L 21/2007 |
| | | | 428/426 |
| 2015/0377991 A1 | 12/2015 | Astra et al. | |
| 2016/0139219 A1* | 5/2016 | Stautner | G01R 33/3804 |
| | | | 324/322 |
| 2017/0284725 A1* | 10/2017 | Wikus | F25D 19/00 |

\* cited by examiner

MAGNETIC COIL SUPPORT IN MAGNETIC RESONANCE IMAGING METHOD AND APPARATUS

BACKGROUND

In general, magnetic resonance imaging (MRI) examinations are based on the interactions among a primary magnetic field, a radiofrequency (RF) electromagnetic field, and time varying electromagnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

During imaging sequences, time varying gradient fields and RF fields are generated by the application of current to a series of gradient coils and RF coils, respectively. Additionally, the primary magnetic field is generated by a permanent magnet or the application of current to a set of primary coils. The primary magnetic field is generally uniform and of significant strength (e.g., 0.5 Tesla (T), 1 T, 2 T, and so on). Superconducting coils may be used to produce high strength magnetic fields such as 1.5 T, 3 T, 7 T, or greater. However, increased magnetic field strengths also increase the forces incurred by the primary coils, which may cause issues for the primary coils' support structure.

BRIEF DESCRIPTION

In one embodiment, an imaging device may include multiple magnetic coils to generate a magnetic field. Additionally, the imaging device may include an outer support affixed to at least one coil of the plurality of magnetic coils and an axial support between at least two coils of the plurality of magnetic coils, wherein the outer support and the axial support operatively share a load corresponding to the generated magnetic fields.

In another embodiment, a hybrid coil support system may include an outer diameter support attached to an outer surface of multiple superconducting magnetic coils via an adhesive layer. The outer diameter support may provide structural support for the superconducting magnetic coils against forces generated by the superconducting magnetic coils while in operation. The hybrid coil support may also include spacing supports located between adjacent superconducting magnetic coils to provide structural support for the superconducting magnetic coils against the forces generated by the superconducting magnetic coils while in operation. The forces may be shared amongst the outer diameter support and the plurality of spacing supports.

In another embodiment, a magnetic resonance imaging system may include multiple main coils to generate a magnetic field along a central axis of the main coils. The magnetic resonance imaging system may also include an inner diameter support affixed to the main coils to bear a first portion of a load to support the main coils against a Lorentz force generated by the magnetic field. The first portion of the load may manifest in shear stresses in the inner diameter support and the main coils. The magnetic resonance imaging system may also include a spacing support between at least two of the main coils to bear a second portion of the load manifesting in compressive stresses in the spacing support and the at least two main coils. Additionally, the shear stresses may be less than the compressive stresses.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
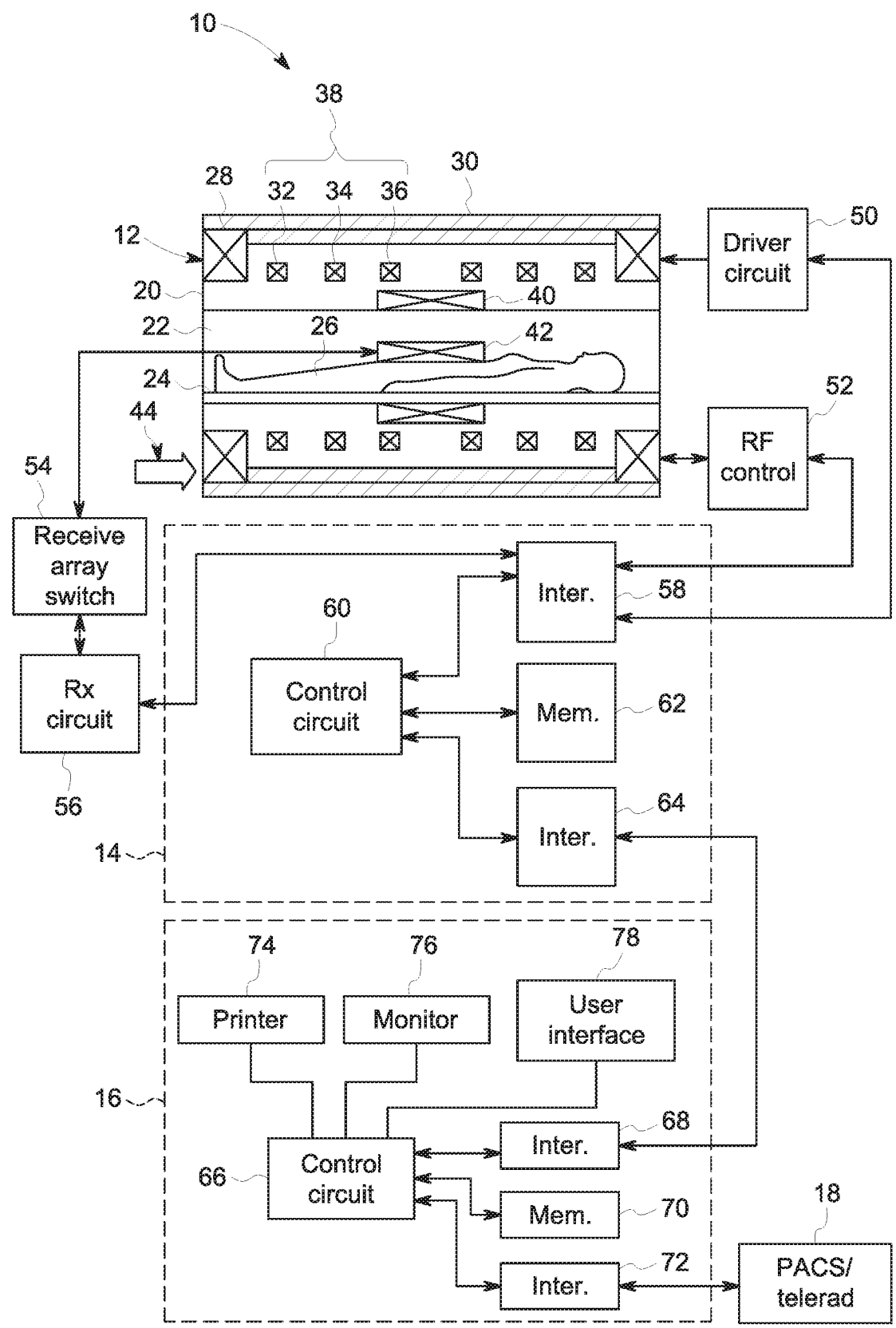
FIG. 1 illustrates a magnetic resonance imaging (MRI) system having primary magnetic coils supported by a hybrid coil support structure, in accordance with an aspect of the present disclosure.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

In general, magnetic resonance imaging (MRI) is based on the interactions of a primary magnetic field, time varying magnetic gradient fields, and a radiofrequency (RF) field with gyromagnetic material within a subject of interest (e.g., a patient). Certain gyromagnetic materials, such as hydrogen nuclei in water molecules, have characteristic behaviors in response to external electromagnetic fields (e.g., constant or time varying electric fields, magnetic fields, or a combination thereof). The precession of spins of these nuclei can be influenced by manipulation of the fields to produce RF signals that can be detected, processed, and used to reconstruct a useful image.

The primary magnetic field may be approximately uniform in the area in which the subject of interest is located and of any suitable strength (e.g., 0.3 Tesla (T), 1.5 T, 3 T, 7 T, or greater than 7 T). To generate the primary magnetic field, electrical current may be applied through one or more primary coils. In some embodiments, the primary coils may include superconducting coils to increase the current flow and, thus, the strength of the primary magnetic field.

Along with the increased magnetic field strength, the forces incurred due to the magnetic fields are increased as well. For example, in some embodiments, a 7 T primary coil may generate magnetic forces of over 1000 tons pulling the primary coils together. As such, it is now recognized that a hybrid coil support structure capable of shedding such a load may be used to hold the primary coils in place. In some embodiments, the hybrid coil support structure may include spacing supports between the primary coils, an outer support along the outer diameter of the primary coils, and/or an inner support along the inner diameter of the primary coils attaching to and holding each primary coil apart from each other and in position within the MIll system. The hybrid coil support structure may allow for a shared load between the spacing supports and the outer and/or inner support to minimize and/or balance shear stresses and compressive stresses within the primary coils. Furthermore, as should be appreciated, the hybrid coil support structure discussed herein may be implemented in any suitable implementation of supporting magnetic coils, and is, thus, not limited to uses within an MM system.

As set forth above, the embodiments described herein may be implemented as a part of an MM system, wherein specific imaging routines are initiated by a user (e.g., a radiologist). Thus, the system may perform data acquisition, data construction, and in certain instances, image synthesis. Accordingly, referring to FIG. 1, an imaging system 10 is illustrated schematically as including a scanner 12, scanner control circuitry 14, and system control circuitry 16.

The imaging system 10 additionally includes remote access and storage systems 18 and/or devices such as picture archiving and communication systems (PACS), or other devices such as teleradiology equipment so that data acquired by the imaging system 10 may be accessed on- or off-site. In this way, MIll data may be acquired, followed by on- or off-site processing and evaluation. While the imaging system 10 may include any suitable scanner or detector, in the illustrated embodiment, the imaging system 10 includes a full body scanner 12 having a housing 20 through which an opening (e.g., an annular opening) is formed to accommodate a bore tube 22. The bore tube 22 may be made of any suitable material such as a non-metallic and/or non-magnetic material. A table 24 is moveable into the bore tube 22 to permit a patient 26 to be positioned therein for imaging selected anatomy within the patient. In some embodiments, the bore tube 22 may support the table 24 and/or articulation components (e.g., a motor, pulley, and/or slides).

The scanner 12 may include a series of associated conductive coils for producing controlled electromagnetic fields for exciting the gyromagnetic material within the anatomy of the subject being imaged. Specifically, primary magnet coils 28 are provided for generating a primary magnetic field, which is generally aligned with the bore tube 22. As discussed above, the primary magnetic coils 28 may be made of a superconductor, which during operation, may generate the primary magnetic field to strengths greater than 1 T. A hybrid coil support structure 30 may support the primary magnetic coils 28 and maintain their position within the scanner 12 under the forces sustained during operation.

A series of gradient coils 32, 34, and 36 (collectively 38) permit controlled magnetic gradient fields to be generated for positional encoding of certain of the gyromagnetic nuclei within the patient 26 during examination sequences. Additionally, an RF coil 40 may generate radio frequency pulses for exciting the certain gyromagnetic nuclei within the patient 26. In addition to the coils that may be local to the scanner 12, the imaging system 10 may also include a set of receiving coils 42 (e.g., an array of coils) to be placed proximal to (e.g., against) the patient 26. As an example, the receiving coils 42 can include cervical/thoracic/lumbar (CTL) coils, head coils, single-sided spine coils, and so forth. Generally, the receiving coils 42 are placed close to or on top of the patient 26 so as to receive the weak RF signals (e.g., weak relative to the transmitted pulses generated by the scanner coils) that are generated by certain of the gyromagnetic nuclei within the patient 26 as they return to their relaxed state. In some embodiments, the RF coils 40 may both transmit and receive RF signals accomplishing the role of the receiving coils 42.

The various coils of the imaging system 10 may be situated within the housing 20 of the scanner 12, and are controlled by external circuitry to generate the desired field and pulses, and to read emissions from the gyromagnetic material in a controlled manner. In the illustrated embodiment, a main power supply 44 provides power to the primary magnetic coils 28 to generate the primary magnetic field. A driver circuit 50 may include amplification and control circuitry for supplying current to the coils as defined by digitized pulse sequences output by the scanner control circuitry 14.

An RF control circuit 52 is provided for regulating operation of the RF coil 40. The RF control circuit 52 includes a switching device for alternating between the active and inactive modes of operation, wherein the RF coil 40 transmits and does not transmit signals, respectively. The RF control circuit 52 may also include amplification circuitry to generate the RF pulses. Similarly, the receiving coils 42, or RF coils 40 if no separate receiving coils 42 are implemented, are connected to a switch 54, which is capable of switching the receiving coils 42 between receiving and non-receiving modes. Thus, the receiving coils 42 may resonate with the RF signals produced by relaxing gyromagnetic nuclei from within the patient 26 while in the receiving mode, and avoid resonating with RF signals while in the non-receiving mode. Additionally, a receiving circuit 56 may receive the data detected by the receiving coils 42 and may include one or more multiplexing and/or amplification circuits.

It should be noted that while the scanner 12 and the control/amplification circuitry described above are illustrated as being connected by single lines, one or more cables or connectors may be used depending on implementation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner 12 and the scanner control circuitry 14 and/or system control circuitry 16.

As illustrated, the scanner control circuitry 14 includes an interface circuit 58, which outputs signals for driving the gradient field coils 38 and the RF coil 40 and for receiving the data representative of the magnetic resonance signals produced in examination sequences. The interface circuit 58 may be connected to a control and analysis circuit 60. The control and analysis circuit 60 executes the commands to the driver circuit 50 and control circuit 52 based on defined protocols selected via system control circuitry 16.

The control and analysis circuit 60 may also serve to receive the magnetic resonance signals and perform subsequent processing before transmitting the data to system control circuitry 16. Scanner control circuitry 14 may also include one or more memory circuits 62, which store configuration parameters, pulse sequence descriptions, examination results, and so forth, during operation.

A second interface circuit 64 may connect the control and analysis circuit 60 to a system control circuit 66 for exchanging data between scanner control circuitry 14 and system control circuitry 16. The system control circuitry 16 may include a third interface circuit 68, which receives data from the scanner control circuitry 14 and transmits data and commands back to the scanner control circuitry 14. As with the control and analysis circuit 60, the system control circuit 66 may include a computer processing unit (CPU) in a multi-purpose or application specific computer or workstation. System control circuit 66 may include or be connected to a second memory circuit 70 to store programming code for operation of the imaging system 10 and to store the processed image data for later reconstruction, display and transmission. The programming code may execute one or more algorithms that, when executed by a processor, are configured to perform reconstruction of acquired data.

An additional input output (I/O) interface 72 may be provided for exchanging image data, configuration parameters, and so forth with external system components such as remote access and storage systems 18. Finally, the system control circuit 66 may be communicatively coupled to various peripheral devices for facilitating an operator interface and for producing hard copies of the reconstructed images. In the illustrated embodiment, these peripherals include a printer 74, a monitor 76, and a user interface 78 including, for example, devices such as a keyboard, a mouse, a touchscreen (e.g., integrated with the monitor 76), and so forth.

In operation, a user (e.g., a radiologist) may configure and/or oversee control of the imaging system 10. Additionally, the user may assist in positioning the subject (e.g., a patient 26) within the bore tube 22. In some embodiments, the bore tube 22 may surround an entire subject or just a portion thereof (e.g., a patient's head, thorax, or extremity). When activated, the main power supply 44 may supply electrical current to the gradient coils 38, the RF coils 40, and the primary magnetic coils 28. As discussed in further detail below, the energized primary magnetic coils 28 of the scanner 12 may induce large forces (e.g., 100 tons, 1000 tons, 1500 tons, etc.) pulling them together.

Figure 2:
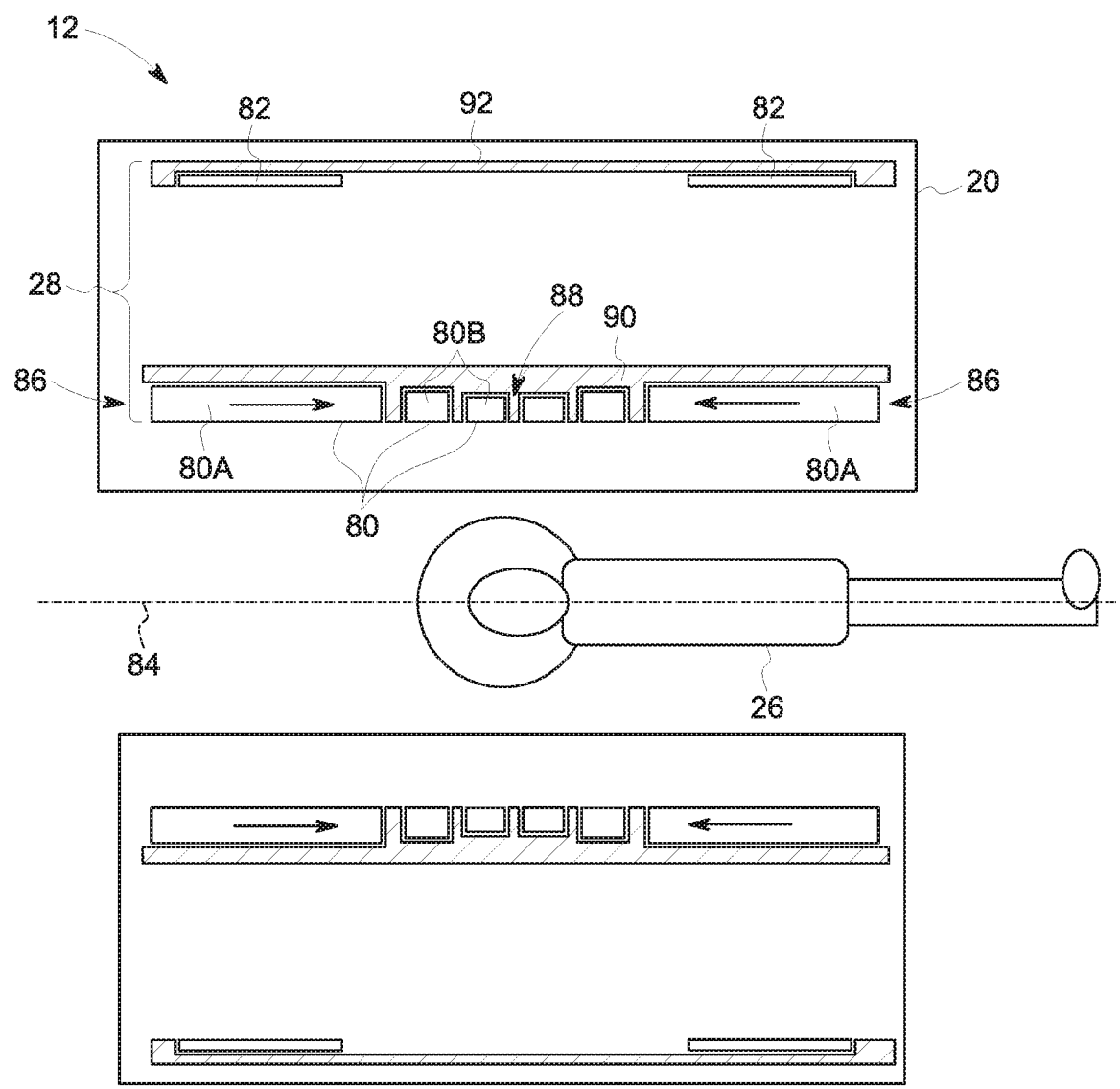
FIG. 2 is a partial cross-sectional view of the MRI system of FIG. 1 having an arrangement of primary magnetic coils, in accordance with an aspect of the present disclosure.

FIG. 2 is a cross sectional view of a portion of the scanner 12 depicting an example arrangement of primary magnetic coils 28 in accordance with embodiments of the present disclosure. In one embodiment, the primary magnetic coils 28 include a set of main coils 80 and one or more shielding coils 82 (e.g., bucking coils) surrounding the patient 26. Further, the main coils 80 and shielding coils 82 may be annular and centered about a central axis 84 of the scanner 12.

The main coils 80 may include coils of multiple sizes and may be arranged in any suitable manner depending on implementation. For example, larger main coils 80A may be situated toward an exterior end 86 of the scanner 12, and smaller main coils 80B may be situated toward a center 88 of the scanner 12. As should be appreciated, the center 88, as illustrated, is a central location between the main coils 80 and may or may not correspond to the geometric center of the scanner 12. The size of each main coil 80 may correspond to the number of ampere-turns, and, as such, the larger main coils 80A may, individually, induce larger magnetic fields than the smaller main coils 80B.

The main coils 80 are used to purposefully generate the large magnetic fields, for example, to interact with the RF fields, gradient fields, and/or the patient 26. However, the large magnetic fields produced by the main coils 80 may also affect devices outside the scanner 12. As such, magnetic shielding may be used within the scanner 12 to dampen the magnetic fields and/or other electromagnetic interference to reduce the strength of the magnetic fields outside the scanner 12. In one embodiment, the shielding coils 82 may induce magnetic fields opposite that of the main coils 80, for example, by applying current in the opposite direction to that of the main coils 80. The opposing magnetic fields may help cancel each other in areas where strong magnetic fields may not be desired (e.g., outside the scanner 12).

To produce the magnetic fields generated by the main coils 80 and the shielding coils 82, current may be applied through electrically conductive coils, and the flow of moving charges through the coils induces the magnetic fields. The flow of current in the primary magnetic coils 28 may also produce heat to be dissipated. Further, as mentioned above, the primary magnetic coils 28 may be made of a superconductor. In general, superconductors innately have very little resistance, and are, therefore, effective in generating large magnetic fields due to the large amounts of electrical current that may be passed through them with high efficiency. Any suitable superconductor may be used to produce the primary magnetic coils 28. However, many materials have temperature ranges and/or thresholds (e.g., a critical temperature) that transition the material into a superconductive state, and, in general, such temperatures are much less than room temperature. For example, in some embodiments, the critical temperature may be less than 93 Kelvin (K) (e.g., for yttrium barium copper oxide (YBCO) superconductors), less than 39 K (e.g., for $MgB_2$ superconductors), less than 18 K (e.g., for $Nb_3Sn$ superconductors), or less than 9.2 K (e.g., (for NbTi superconductors). As such, the primary magnetic coils 28 may be cooled to a temperature below the critical temperature and/or to mitigate heat generated or transferred to the primary magnetic coils 28.

As discussed above, the magnetic fields generated by the primary magnetic coils 28 may produce large forces between them. For example, the Lorentz forces, attractive/repulsive magnetic forces between the main coils 80, may be greater than 1000 tons, depending on implementation (e.g., depending on the strength of the main coils 80). Further, as the main coils 80 are attracted together (e.g., forced toward center 88 of the scanner 12), the shielding coils 82, producing an opposing magnetic field to that of the main coils 80, may be pushed apart from one another (e.g., towards the exterior end 86 of the scanner 12). The hybrid coil support structure 30 may include a main coil support 90 and/or a shielding coil support 92 to support the primary magnetic coils 28 and withstand the forces generated thereby.

Figure 3:
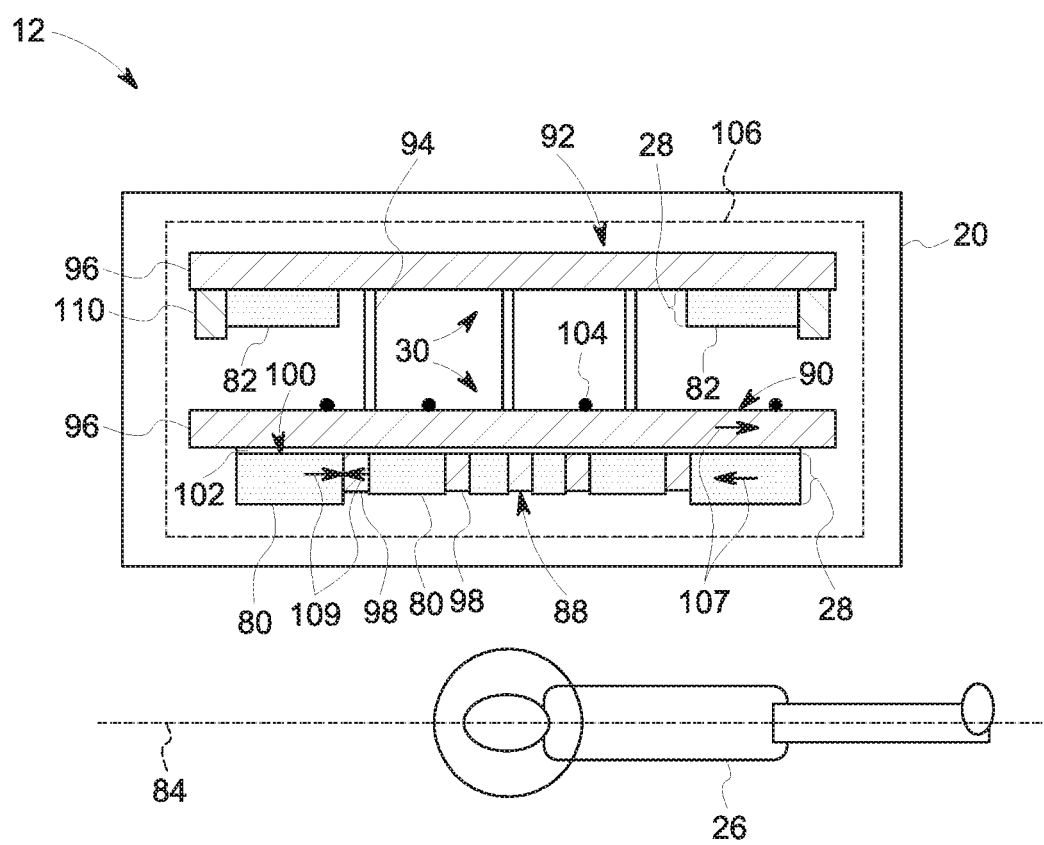
FIG. 3 is a partial cross-sectional of the MRI system of FIG. 1 having primary magnetic coils and the hybrid coil support structure, in accordance with an aspect of the present disclosure.

FIG. 3 is a cross-sectional view of a portion of the scanner 12 depicting the primary magnetic coils 28 and the hybrid coil support structure 30. As discussed above, the hybrid coil support structure may include the main coil support 90 supporting the main coils 80, and the shielding coil support 92 supporting the shielding coils 82. The main coil support 90 and the shielding coil support 92 may be held together and supported by one or more support structures 94.

The main coil support 90 may include an outer diameter support 96 and one or more spacing supports 98. The outer diameter support 96 may form a cylindrical structure around one or more of the main coils 80 on the outer surface 100 (e.g., on the outer diameter) of the main coils 80. Further, the outer diameter support 96 may form a single cylindrical structure over multiple main coils 80 or be split into multiple cylinders each covering one or more main coils 80. The outer diameter support 96 may be attached to the outer surface 100 (e.g., on the outer diameter) of the main coils 80, for example, via an adhesive layer 102 such as an epoxy resin. The adhesive layer 102 may assist in dispersing stresses evenly among the surface and axial length of the primary magnetic coils 28 and outer diameter support 96. Additionally, the adhesive layer 102 may maintain structural integrity and effectively transfer forces between the main coils 80 and the outer diameter support 96 through a range of temperatures (e.g., from room temperature to an operating temperature of the primary magnetic coils 28).

In some embodiments, a thermally conductive material with high strength such as aluminum or aluminum alloy may be used for the outer diameter support 96 to provide sufficient structural support while also allowing the heat transfer to one or more cooling tubes 104. The cooling tubes 104 may allow flow of a cooling fluid (e.g., liquid nitrogen or liquid helium) to maintain the primary magnetic coils 28 at a suitable temperature (e.g., near or below a critical temperature), for example, by thermosiphon cooling. The outer diameter support 96 may also have similar material properties (e.g., modulus and/or coefficient of thermal expansion) as the main coils 80 to avoid changes in shape and/or size different from the main coils 80, for example, due to temperature changes and/or stresses. In one embodiment, the main coils 80 and the main coil support 90 may be implemented within a cryostat 106 to maintain the main coils 80 in a superconducting state. Moreover, the cryostat 106 may be surrounded by a thermal shield and include a vacuum seal to assist in maintaining efficient temperature control.

As discussed herein, the outer diameter support 96 assists in maintaining the main coils 80 in position by holding them on their outer surface 100. However, in some scenarios (e.g., for primary magnetic coils 28 generating magnetic fields greater than 1 T, greater than 3 T, or greater than 5 T) the stresses incurred due to the strong Lorentz forces may be greater than desired and/or greater than the material properties of the outer diameter support 96 and/or main coils 80 allow. For example, because the outer diameter support 96 attaches to the main coils 80 on the outer surface 100, the shear forces 107 in the main coils 80 and/or the outer diameter support 96 may be unacceptable. In some embodiments, gussets may be utilized within or on the outer diameter support 96 to further strengthen the outer diameter support 96 and/or spread loads in highly stressed areas. Additionally, the main coil support 90 may also include one or more spacing supports 98 between the main coils 80 to limit the shear forces 107 and support the main coils 80 via axial forces (e.g., compressive forces) 109. For example, as the main coils 80 are attracted towards the center 88 of the scanner 12, the spacing supports 98 may be squeezed in the axial direction (e.g., in the direction of the axis 84). As with the outer diameter support 96, the spacing supports 98 may be made of a material compatible with the coefficient of thermal expansion similar to that of the main coils 80 (e.g., within 5%, 10%, or 20%). In some embodiments, the spacing supports 98 may be made of composite materials and structures, for example, wires (e.g., copper wires) wet-wound with an adhesive (e.g., epoxy resin). Additionally, the adhesive may include ceramic fillers. Furthermore, the spacing supports 98 may be made of metal alloys (e.g., aluminum, titanium), ceramics, reinforced plastics (e.g., fiber reinforced plastics), and/or adhesives such as epoxy resin.

Similar to the outer diameter support 96, when used alone in scenarios of high forces, the spacing supports 98 may not provide adequate stress shedding. As such, hybridizing the main coil support 90 with both the outer diameter support 96 and the spacing supports 98 allows for the large Lorentz forces to be shared by both, for example, to prevent coil quench. Additionally, the moduli and/or sizes of the outer diameter support 96 and the spacing supports 98 may be chosen to split the load of Lorentz forces equally or unequally, depending on application. For example, in some embodiments, the shear forces 107 may be kept within a set parameter (e.g., a threshold for shear stress in the main coils 80). As such, the outer diameter support 96 may take on between 10% and 50% (e.g., 15%, 25%, or 45%) of the total Lorentz force for a particular main coil 80.

Figure 4:
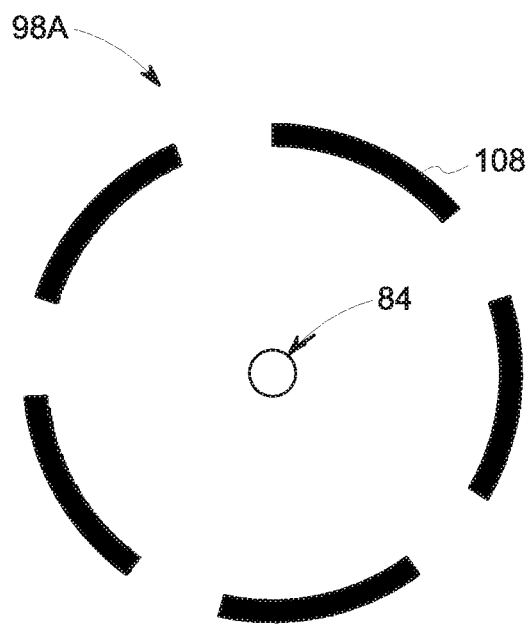
FIG. 4 is an axial view of an example embodiment of a spacing support, in accordance with an aspect of the present disclosure.
Figure 5:
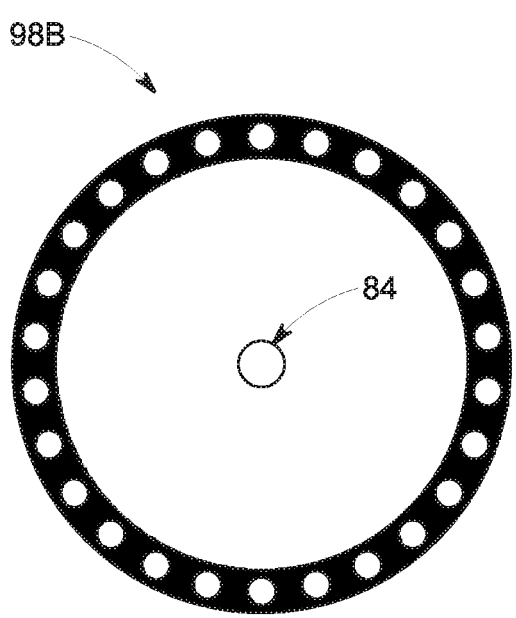
FIG. 5 is an axial view of an example embodiment of a spacing support, in accordance with an aspect of the present disclosure.

FIGS. 4 and 5 are axial views of example spacing supports 98 to be implemented between the main coils 80. For example, in the embodiment of FIG. 4, a distributed spacing support 98A may be made of multiple discrete components 108 distributed circumferentially (e.g., evenly distributed) around the axis 84 of the scanner 12 and/or the main coils 80. Additionally or alternatively, a porous spacing support 98B, as depicted in FIG. 5, may be implemented in the axial gap between the main coils 80. As discussed above, the spacing supports 98 may be machined or manufactured from solid or composite materials. Further, such manufacturing may include additive manufacturing such as three-dimensional printing.

Returning now to FIG. 3, the shielding coil support 92 may also have an outer diameter support 96 to support the shielding coils 82, in a similar manner as was accomplished with the main coils 80. As with the main coil support 90, the outer diameter support 96 of the shielding coil support 92 may be split into multiple cylinders or implemented as a single annular support. Additionally, the shielding coil support 92 may include an outer flange support 110. In a similar manner as the spacing supports 98, the outer flange support 110 may assist in spreading the Lorentz forces generated by the shielding coils 82, between the outer diameter support 96 (e.g., via shear forces 107) and an axial support. However, similar to configurations where the spacing supports 98 are placed between the main coils 80, the outer flange support 110 may be positioned towards the exterior end 86 of the scanner 12 adjacent the shielding coils 82. Shielding coils 82 may, in operation, be forced away from the center 88 of the scanner 12, via the Lorentz forces. Moreover, the Lorentz forces of the shielding coils 82 may be shared between the outer diameter support 96 and the outer flange support 110 in any suitable manner. For example, the outer diameter support 96 may sustain 15%, 25%, 50%, 75%, or 100% (e.g., implemented without the outer flange support 110 or for use a backup support) of the total Lorentz force for a given shield coil 82.

Figure 6:
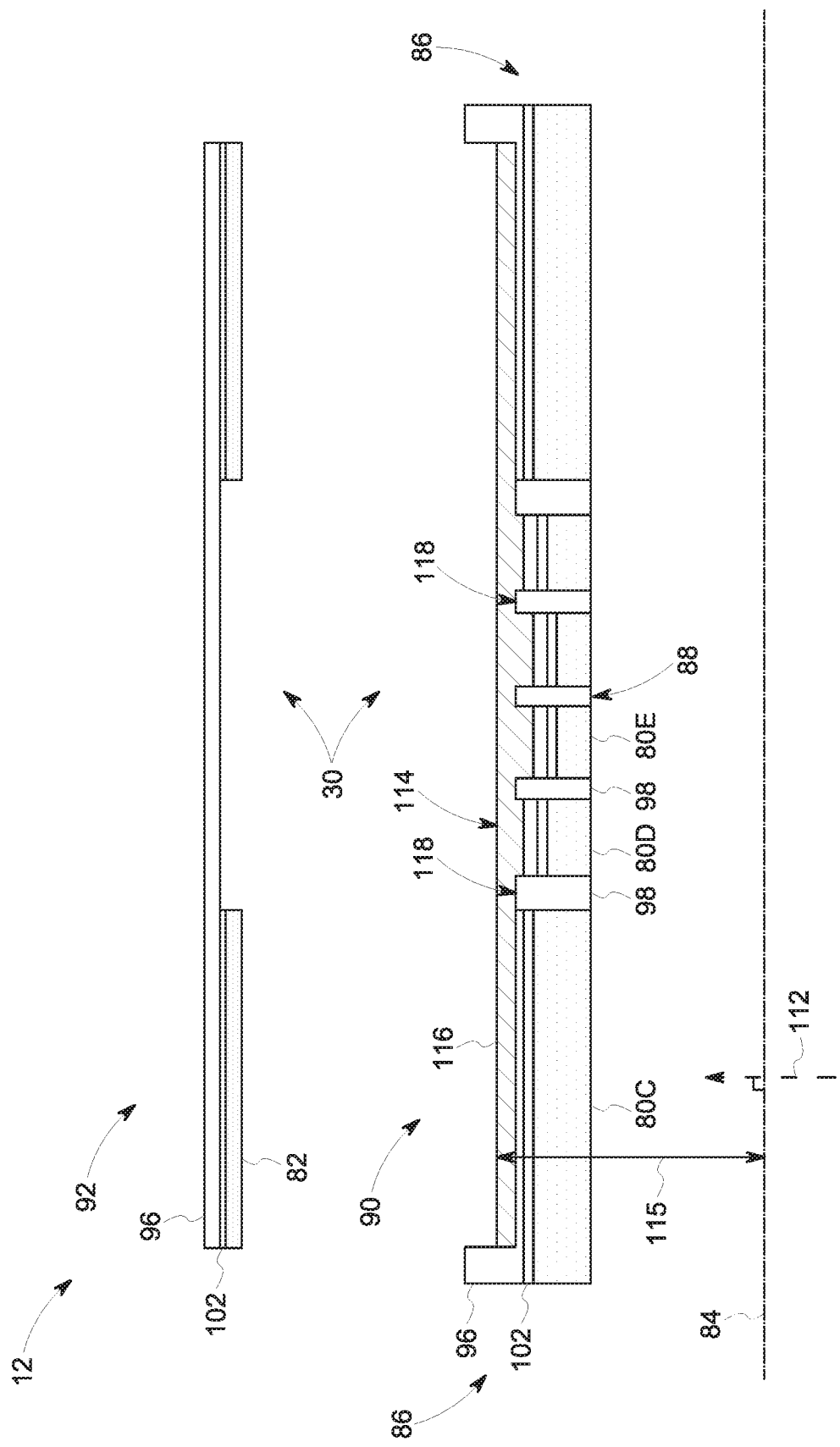
FIG. 6 is a partial cross-sectional view of an example arrangement of primary magnetic coils and relative positions of support elements of the hybrid coil support structure, in accordance with an aspect of the present disclosure.

As discussed above, the primary magnetic coils 28 may be implemented in a number of arrangements and/or sizes. In one embodiment, the smaller main coils 80B (e.g., smaller in the axial direction) may be arranged towards the center 88 of the scanner 12 between the larger main coils 80A (e.g., larger in the axial direction). Furthermore, in some embodiments, the main coils 80 may have different thicknesses in the radial direction 112 (e.g., perpendicular to the axis 84), as depicted in the example cross sectional view of the scanner 12 in FIG. 6. For example, relatively thick main coils 80C may be arranged towards the exterior end 86 of the scanner 12 relative to medium main coils 80D and/or thin main coils 80E, which may be arranged towards the center 88 of the scanner 12. As should be appreciated, the terms thick, medium, and thin are relative terms to compare the coils to one another and may correspond to any suitable coil thickness within the scanner 12 depending on implementation. Further, the main coil support 90 may also have a varied radial thickness, for example, corresponding to the various main coils 80.

As demonstrated in the illustrated embodiment, the main coil support 90 may be thicker in the regions of medium main coils 80D than in regions of the thick main coils 80C. Further, the main coil support 90 may be thicker in the regions of the thin main coils 80E than the medium main coils 80D. In some embodiments, the main coil support 90 may from a uniform cylindrical outer edge 114 over each of the main coils 80. For example, the distance 115 from the axis 84 to the outer edge 114 of the main coil support 90 may be approximately (e.g., within 1 inch) the same proximate each of the main coils 80. Furthermore, as discussed above, the main coil support 90 may include an outer diameter support 96 with a gusset 116 overlaid upon the outer diameter support 96. In some embodiments, the outer diameter support 96 may have an increased thickness and be implemented without a gusset. The outer diameter support 96 may be implemented between the spacing supports 98 and/or outside the outer diameter 118 of the spacing supports 98. Further, the gusset 116 may be implemented solely outside the outer diameter of the spacing supports 98 or extend, at least proximate some main coils 80, from the outer edge of the main coil support 90 towards the axis 84 and past the outer diameter 118 of the spacing supports 98. By implementing at least a portion of the outer diameter support 96 and/or the gusset 116 between the spacing supports 98 the axial stresses may be shared between the spacing supports 98 and the outer diameter support 96 and/or gusset 116. As such, the outer diameter support 96 and/or gusset, if implemented, may incur shear and/or axial stresses, and share the overall Lorentz forces due to the operation of the primary magnetic coils 28 with the spacing supports 98.

Figure 7:
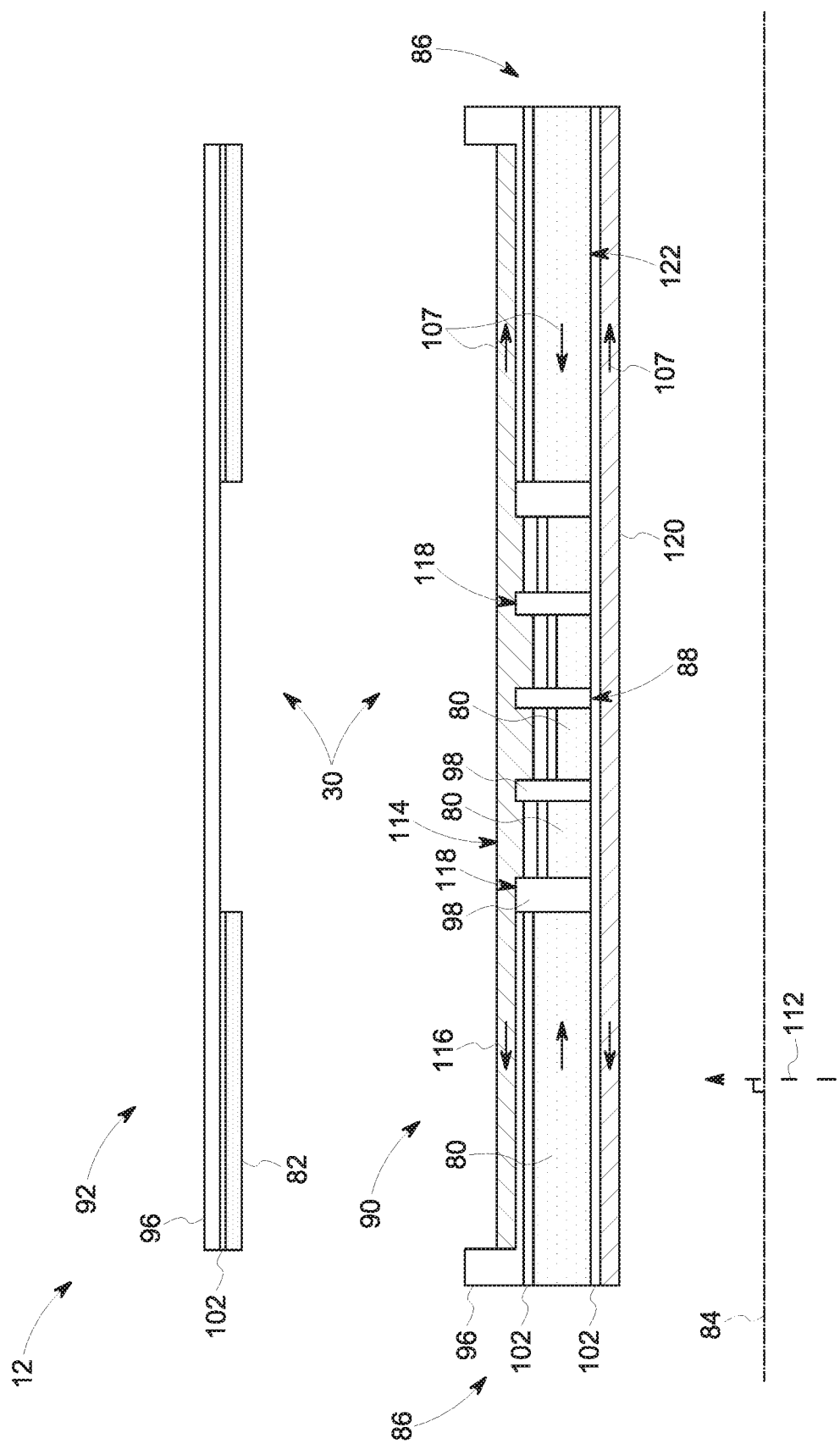
FIG. 7 is a partial cross-sectional view of an example arrangement of primary magnetic coils and relative positions of support elements of the hybrid coil support structure including an inner diameter support, in accordance with an aspect of the present disclosure.

In addition to or in the alternative to the outer diameter support 96, the main coil support 90 may include an inner diameter support 120 to be implemented with the spacing support 98, for example, as shown in FIG. 7. Moreover, in some embodiments, an inner diameter support 120 may be implemented on the shielding coils 82 in addition to or instead of the outer diameter support 96.

With respect to the main coils support 90, the inner diameter support 120 may be affixed to an inner surface 122 of the main coils 80, relative to the radial direction 112. In a similar manner to that of the outer diameter support 96, the inner diameter support 120 may be affixed to the main coils 80 to keep the main coils 80 in place during operation of the scanner 12. Furthermore, the inner diameter support 120 may share the overall Lorentz forces generated by the main coils 80 with the outer diameter support 96 and/or the spacing supports 98, for example, via shear forces 107.

In some embodiments, the inner diameter support 120 may include a cylindrical tube affixed to an approximately flush inner surface 122 of the main coils 80 and/or spacing supports 98, as depicted in FIG. 7. Additionally or alternatively, the inner diameter support 120 may mirror the outer diameter support 96 about the main coils 80, and may include an adhesive layer 102, for example to affix the inner diameter support to the main coils 80, and/or gusset 116, for example for additional structural support. As with the outer diameter support 96, the inner diameter support 120 may be made of any suitable material such as, titanium, copper, nickel, metal alloy (e.g., titanium alloy, nickel alloy, etc.), carbon fiber, or fiber-reinforced plastic (FRP). In some embodiments, materials with high modulus (e.g., Young's modulus) and relatively low coefficient of thermal expansion (e.g., titanium) may allow for increased strength capacity while maintaining a thin profile in the radial direction 112. Such a thin profile may allow for increased space within the inner diameter support 120, for example, for the bore tube 22 and/or patient 26. Additionally, a coefficient of thermal expansion less than that of the main coils 80, may assist in generating a bonded joint between the main coils 80 and the inner diameter support 120 that is under compression during scanner 12 operation, assisting the transfer of loads to the inner diameter support 120.

Additionally, the inner diameter support 120 may include a single layer or multiple layers of the same or different materials. For example, the inner diameter support 120 may include a high modulus layer (e.g., titanium, copper, nickel, metal alloy (e.g., titanium alloy, nickel alloy, etc.), or carbon fiber) and a low modulus layer (e.g., having a lower modulus than the high modulus layer) such as FRP, a phenolic composite material, or other suitable material with a modulus less than the high modulus layer. In some embodiments, the low modulus layer may be a thin (e.g., less than 0.1 millimeters (mm), less than 1 mm, less than 3 mm, or less than 10 mm) layer of material between the main coils 80 and the high modulus layer, for example, to reduce local shear stresses (e.g., at corners and/or throughout the length of the inner diameter support 120) between the main coils and the inner diameter support 120.

The inner diameter support 120 may be implemented as part of the main coil support 90 and/or shielding coil support 92 of the hybrid coil support structure 30. The hybrid nature of using multiple different types of support structures, such as the inner diameter support 120, the outer diameter support 96, and/or the spacing supports, spreads the load generated by the operation of the primary magnetic coils 28 amongst the different support structures and maintains the primary magnetic coils 28 in place during operation.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An imaging device comprising:
a plurality of primary magnetic coils configured to generate a magnetic field via current flow through each of the plurality of primary magnetic coils;
an outer diameter support structure comprising one or more cylindrical structures affixed to at least one coil of the plurality of primary magnetic coils; and
at least two axial spacing supports distributed circumferentially around an axis of the imaging device, wherein each axial spacing support of the at least two axial spacing supports is positioned within an axial gap formed between a respective pair of coils of the plurality of primary magnetic coils, wherein at least one of the one or more cylindrical structures of the outer diameter support structure is positioned between a respective pair of the at least two axial spacing supports.

2. A hybrid coil support system comprising:
an outer diameter support structure comprising one or more cylindrical structures attached to an outer surface of a plurality of superconducting primary magnetic coils of an imaging device via an adhesive layer and configured to provide structural support for the plurality of superconducting primary magnetic coils against forces generated by the plurality of superconducting primary magnetic coils while in operation; and
a plurality of axial spacing supports distributed circumferentially around an axis of the imaging device and each located within an axial gap formed between respective adjacent coils of the plurality of superconducting primary magnetic coils and configured to provide structural support for the plurality of superconducting primary magnetic coils against the forces generated by the superconducting primary magnetic coils while in operation, wherein the forces are shared amongst the outer diameter support structure and the plurality of axial spacing supports, and wherein at least one of the one or more cylindrical structures of the outer diameter support structure is positioned between a respective pair of the plurality of axial spacing supports.

3. A magnetic resonance imaging system comprising:
a plurality of primary coils configured to generate a magnetic field along a central axis of the plurality of primary coils;
an inner diameter support structure comprising a cylindrical structure affixed to the plurality of primary coils along an inner diameter of the plurality of primary coils, wherein the cylindrical structure of the inner diameter support structure has a uniform thickness in a radial direction; and
at least two axial spacing supports distributed circumferentially around the central axis, wherein each axial spacing support of the at least two axial spacing supports is positioned within an axial gap formed between a respective pair of coils of the plurality of primary coils.

4. The imaging device of claim 1, wherein the plurality of primary magnetic coils comprise a plurality of superconducting coils maintained at or below a temperature threshold for superconductivity, wherein the temperature threshold corresponds to a material composition of the plurality of superconducting coils.

5. The imaging device of claim 1, wherein the outer diameter support structure and the at least two axial spacing supports share a load on the plurality of primary magnetic coils that corresponds to the current flow and the generated magnetic field during operation, wherein the load comprises a force operatively pulling the at least one coil of the plurality of primary magnetic coils axially toward a mid-plane of the imaging device, wherein the outer diameter support structure is configured to maintain a position of the at least one coil of the plurality of primary magnetic coils by bearing at least a first portion of the load.

6. The imaging device of claim 5, wherein the first portion of the load induces shear stresses in the at least one coil.

7. The imaging device of claim 5, wherein the axial supports are configured to bear a second portion of the load, wherein the second portion of the load induces axial stresses in the at least one coil.

8. The imaging device of claim 7, wherein the first portion of the load is less than the second portion of the load.

9. The imaging device of claim 1, wherein the outer diameter support structure is affixed to an outer surface of the at least one coil of the plurality of primary magnetic coils via an epoxy layer.

10. The imaging device of claim 1, wherein the outer diameter support structure is configured to be affixed or contiguous with the at least two axial spacing supports.

11. The imaging device of claim 1, comprising an inner diameter support structure affixed to the at least one coil of the plurality of primary magnetic coils, wherein the inner diameter support structure comprises at least one cylindrical support affixed to an inner diameter of the at least one coil.

12. The imaging device of claim 1, wherein the plurality of primary magnetic coils comprises at least a first subset of primary magnetic coils of a first thickness in a radial direction and a second subset of primary magnetic coils of a second thickness in the radial direction greater than the first thickness.

13. The imaging device of claim 12, wherein the one or more cylindrical structures of the outer diameter support structure comprises two or more cylindrical structures affixed to the at least one coil of the plurality of primary magnetic coils along an outer diameter of the plurality of primary magnetic coils, wherein a first cylindrical structure of the outer diameter support structure is positioned radially outside the first subset of primary magnetic coils and has a third thickness in the radial direction and a second cylindrical structure of the outer diameter support structure is positioned radially outside the second subset of primary magnetic coils and has a fourth thickness in the radial direction, wherein the fourth thickness is less than the third thickness.

14. The imaging device of claim 12, wherein the first subset of primary magnetic coils has a first axial extent and the second subset of primary magnetic coils has a second axial extent greater than the first axial extent.

15. The hybrid coil support system of claim 2, wherein the outer diameter support structure comprises a gusset on an outer edge of the outer diameter support structure, wherein the gusset is configured to provide additional structural stiffness to the outer diameter support structure.

16. The hybrid coil support system of claim 2, wherein the outer diameter support structure comprises cooling tubes affixed to an outer edge of the outer diameter support structure.

17. The hybrid coil support system of claim 2, wherein the plurality of axial spacing supports comprises a composite material having a first coefficient of thermal expansion within 10% of a second coefficient of thermal expansion of the plurality of superconducting primary magnetic coils.

18. The hybrid coil support system of claim 2, wherein the plurality of axial spacing supports comprise a plurality of separate and discrete components arranged circumferentially around the axis.

19. The hybrid coil support system of claim 2, wherien the one or more cylindrical structures of the outer diameter support structure comprises two or more cylindrical structures attached to the outer surface of the plurality of superconducting primary magnetic coils, wherein a first cylindrical structure of the outer diameter support structure has a first thickness in a radial direction and a second cylindrical structure of the outer diameter support structure has a second thickness in the radial direction, wherein the second thickness is less than the first thickness and wherein the first cylindrical structure and the second cylindrical structure attach to different respective superconducting primary magnetic coils each having different thickness in the radial direction.

20. The hybrid coil support system of claim 19, wherein the different respective superconducting primary magnetic coils comprise a first subset of primary magnetic coils of a third thickness in a radial direction and a second subset of primary magnetic coils of a forth thickness in the radial direction and greater than the third thickness.

21. The magnetic resonance imaging system of claim 3, wherein the inner diameter support structure comprises a first material layer and a second material layer, wherein the first material layer is bonded to the plurality of primary coils between the plurality of primary coils and the second material layer, and wherein the first material layer comprises a Young's modulus less than that of the second material layer.

22. The magnetic resonance imaging system of claim 21, wherein the first material layer comprises fiber-reinforced plastic and the second material layer comprises titanium.

23. The magnetic resonance imaging system of claim 3, wherein the magnetic field is a first magnetic field, the magnetic resonance imaging system comprising a plurality of bucking coils configured to generate a second magnetic field opposite the first magnetic field, wherein each of the plurality of bucking coils is affixed to a shielding outer diameter support structure comprising a second cylindrical structure affixed to the plurality of bucking coils.

24. The magnetic resonance imaging system of claim 3, comprising an outer diameter support structure comprising two or more cylindrical structures affixed to an outer surface of the plurality of primary coils.

25. The magnetic resonance imaging system of claim 3, wherein the plurality of primary coils comprises at least a first subset of primary coils of a first thickness in a radial direction and a second subset of primary coils of a second thickness in the radial direction greater than the first thickness.

* * * * *